United States Patent
Gao et al.

(10) Patent No.: US 8,564,471 B1
(45) Date of Patent: Oct. 22, 2013

(54) HIGH RESOLUTION SAMPLING-BASED TIME TO DIGITAL CONVERTER

(75) Inventors: Xiang Gao, San Jose, CA (US);
 Chih-Wei Yao, Milpitas, CA (US);
 Chi-Hung Lin, Fremont, CA (US); Li Lin, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 27 days.

(21) Appl. No.: 13/333,058

(22) Filed: Dec. 21, 2011

Related U.S. Application Data (60) Provisional application No. 61/430,407, filed on Jan. 6, 2011.

(51) Int. Cl.
 *H03M 1/50* (2006.01)
(52) U.S. Cl.
 USPC .......................................... 341/166; 341/155
(58) Field of Classification Search
 USPC ......... 341/166, 161, 120, 118, 131, 155, 167, 341/157; 327/158, 156, 269, 263, 271
 See application file for complete search history.

(56) References Cited

U.S. PATENT DOCUMENTS 7,609,756 B2 * 10/2009 Wood ........................... 341/155

OTHER PUBLICATIONS

R. B. Staszewski, J.L. Wallberg, S. Rezeq, et al., "All-Digital PLL and Transmitter for Mobile Phones," IEEE J. Solid-State Circuits, vol. 40, No. 12, pp. 2469-2482, Dec., 2005.
N. Da Dalt, E. Thaller, P. Gregorius, et al., "A Compact Triple-Band Low-Jitter Digital LC PLL with Programmable Coil in 130-nm CMOS," IEEE J. Solid-State Circuits, vol. 40, No. 7, pp. 1482-1490, Jul. 2005.
C.-M. Hsu, M.Z. Straayer, and M.H. Perrott, "A Low-Noise, Wide-Bw 3.6GHz Digital Fractional-N ΣΔFrequency Synthesizer with a Noise-Shaping Time-to-Digital Converter and Quantization Noise Cancellation," ISSCC Dig. Tech. Papers, pp. 340-341, Feb., 2008.
M. Straayer and M. Perrott, "An efficient high-resolution 11-bit noise shaping multipath gated ring oscillator TDC," in VLSI Symp. Dig. Tech. Papers, pp. 82-83, Jun. 2008.

* cited by examiner

*Primary Examiner* — Joseph Lauture (57) ABSTRACT

Disclosed is a time-to-digital (TDC) converter comprising an analog voltage source. An analog-to-digital converter quantizes two voltage samples in response to receiving a first input signal at a first time $t_1$ and a second input signal at a second time $t_2$. The first and second digital signals are combined to produce a digital signal that represents the difference $(t_2-t_1)$.

19 Claims, 7 Drawing Sheets

HIGH RESOLUTION SAMPLING-BASED TIME TO DIGITAL CONVERTER

CROSS REFERENCE TO RELATED APPLICATIONS

The present disclosure claims priority to U.S. Provisional App. No. 61/430,407 filed Jan. 6, 2011, the content of which is incorporated herein by reference in its entirety for all purposes.

BACKGROUND

The present disclosure relates generally to time to digital conversion and in particular to a sampling-based conversion.

Unless otherwise indicated herein, the approaches described in this section are not prior art to the claims in this application and are not admitted to be prior art by inclusion in this section.

A Time-to-Digital Converters (TDCs) is typically used to obtain a digital signal that represents a difference in time between two signals. TDCs are widely used for time interval measurements in space science, high-energy physics, laser range finders, and test instrumentation. Recently, TDC usage has been extensively applied to Phase Locked Loops (PLLs) and in particular to digital frequency synthesis using PLLs. In digital PLLs, the resolution of the TDC is an important performance metric which often limits the overall PLL performance. State-of-the-art TDCs are typically implemented based on the timing of gate delays or edge transitions. The resolution of such TDCs is thus limited by the gate delay.

Figure 1:
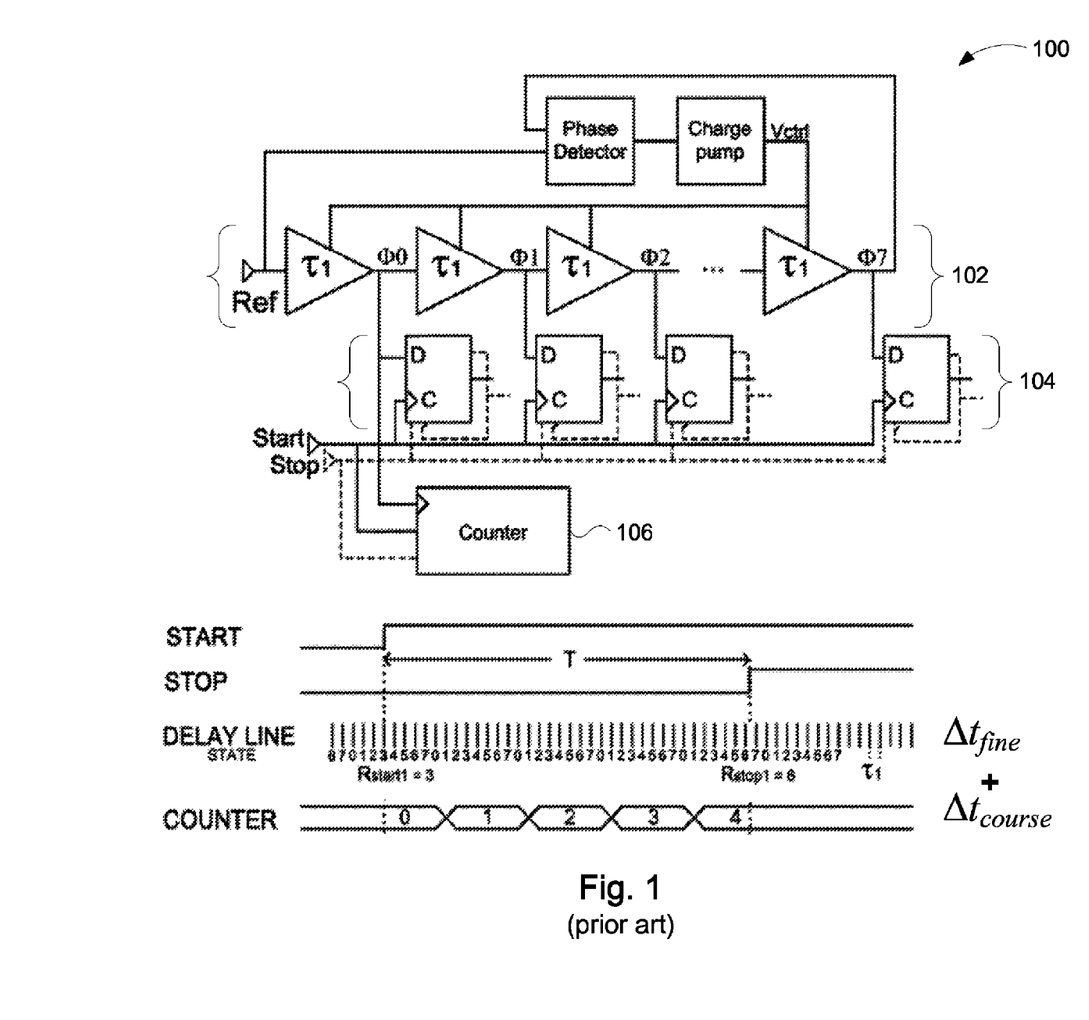
FIG. 1 illustrates a conventional delay-based time-to-digital converter (TDC).

FIG. 1 illustrates a conventional TDC 100, comprising a multistage delay line 102, flip-flops 104, and a counter 106. The time range that can be quantized by the TDC is a function of the number of stages (e.g., inverters) in the delay line 102. The quantization resolution is limited by the minimum gate delay (e.g., τ1) achievable with the particular process technology. For example, Complementary Metal Oxide Semiconductor (CMOS) processes may achieve a gate delay of about 10 pS.

SUMMARY

A method and circuit for converting a time input to a digital signal includes receiving a first input signal and a second input signal. A voltage generator outputs a time-varying analog voltage level. An analog-to-digital converter (ADC) generates a first digital signal when the first input signal is received (e.g., at a time $t_1$), and generates a second digital signal when the second input signal is received (e.g., at a time $t_2$). An encoder combines the first and second digital signals to generate a digital signal that is representative of $(t_2-t_1)$.

In some embodiments, the voltage generator generates a voltage ramp. The encoder further incorporates a slew rate associated with the voltage ramp in order to generate the third digital signal. The resolution of the digital representation of $(t_2-t_1)$ may be determine by the slew rate.

In other embodiments, the voltage generator generates a cyclic waveform, such as for example a triangular waveform or a sawtooth waveform. The TDC may include a counter to a number of transitions of the cyclic waveform during a period of time between the first input signal and the second input signal. The third digital signal may be further based on the number of transitions, in addition to the first digital signal and the second digital signal.

In some embodiments, the TDC may be incorporated into a phase locked loop (PLL). A reference signal of the PLL may serve as the first input signal and an output signal of the PLL may serve as the second input signal.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

Figure 2:
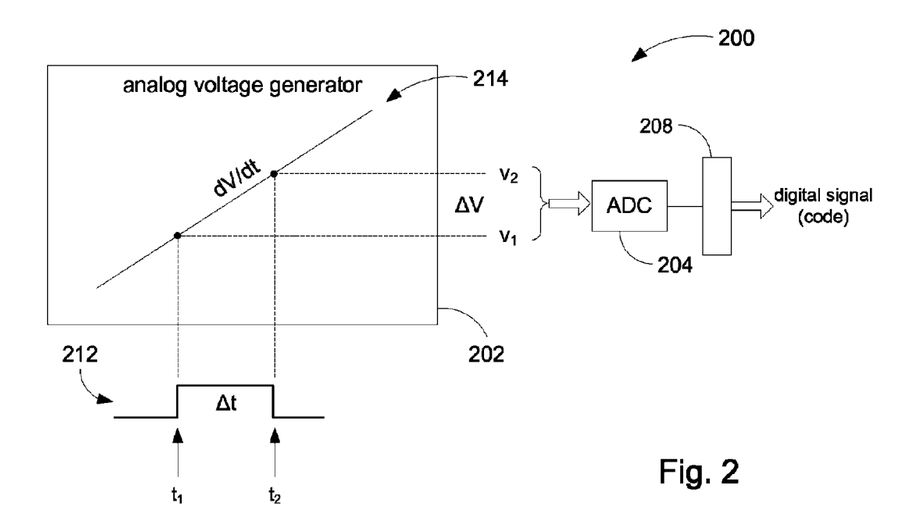
FIG. 2 is a generalized block diagram of an embodiment of a TDC in accordance with the present disclosure.

Referring to FIG. 2, a functional block diagram of a TDC 200 in accordance with embodiments of the present disclosure includes a time-varying analog voltage generator 202 (e.g., voltage ramp), an Analog-to-Digital Converter (ADC) 204, and an encoder 208. A timing signal 212 may be generated when a first input signal (not shown) is received at time $t_1$, and a second input signal (not shown) is received at time $t_2$. The basic function of the TDC 200 is to accept the timing input 212, quantize it using the ADC 204, and output a digital code. By sampling the voltage ramp 214 based on the timing signal 212, a timing difference $\Delta t$ may be converted into voltage difference $\Delta V$ having a gain determined by a slew rate $dV/dt$ of the voltage ramp. Functionally, the ADC 204 quantizes $\Delta V$ to produce a digital signal representative of $\Delta t$. As will be explained in more detail below, the ADC 204 and the encoder 208 cooperate to quantize voltage levels $v_1$ and $v_2$ and to computer or otherwise determine $\Delta t$ in accordance with principles of the present disclosure.

A resolution of the TDC 200 can be calculated as follows:

$$\Delta t_{LSB} = \frac{\Delta V_{LSB}}{dV/dt} = \frac{V_{FS}/2^M}{dV/dt}, \qquad \text{Eqn. 1}$$

where
$\Delta V_{LSB}$ is the quantization step of ADC 204,
$V_{FS}$ is the full scale voltage of ADC 204,
M is the number of bits of ADC 204, and
$dV/dt$ is the slew rate (i.e., slope) of the voltage ramp 214.

CMOS technology can provide a voltage generator 202 having a dV/dt on the order to tens of GV/s; e.g., a 10 GHz sine wave with 0.5 V peak-to-peak swing can be used to generate a voltage ramp having a peak dV/dt of about 30 GV/s. A typical ADC 204 may have 10-bit resolution and a full scale voltage of 1V. A TDC configured with these components can provide a time resolution of:

$$\Delta t_{LSB} = \frac{1 \text{ V}/2^{10}}{30 \text{ GV/s}} \approx 32.5 \text{ fs}, \qquad \text{Eqn. 2}$$

which is orders of magnitude lower than conventional TDCs. In other words, a TDC in accordance with the present disclosure may be able to resolve time differences as low as 32.5 fs.

The foregoing example assumes ideal conditions in order to give an idea how low the resolution can be. However, in a practical system, there is a tradeoff between factors that affect TDC resolution, including design complexity of the voltage generator 202 and the ADC 204, size of the components, component costs, and so on. For example, the performance of the voltage generator 202 and ADC 204 may be scaled back (e.g., for reasons of cost). For example, suppose we relax the slew rate dV/dt of the voltage ramp 214 from 30 GV/s to 6 GV/s, and the ADC resolution from 10-bit to 6-bit. The new TDC resolution is computed as follows:

$$\Delta t_{LSB} = \frac{1 \text{ V}/2^6}{6 \text{ GV/s}} \approx 2.6 \text{ ps}. \qquad \text{Eqn. 3}$$

Even with the significantly reduced performance of the components, the TDC of the present embodiments can still outperform conventional TDC designs. Typical CMOS processes, however, can readily achieve a slew rate of 10 GV/s in the voltage generator 202, and provide 1 mV resolution in the ADC 204. Thus, a TDC 200 in accordance with the present disclosure may can easily achieve the following resolution:

$$\Delta t_{LSB} = \frac{1 \text{ mV}}{10 \text{ GV/s}} \approx 0.1 \text{ ps}, \qquad \text{Eqn. 4}$$

which is about 100 times better than a conventional gate-delay TDC.

Figure 3:
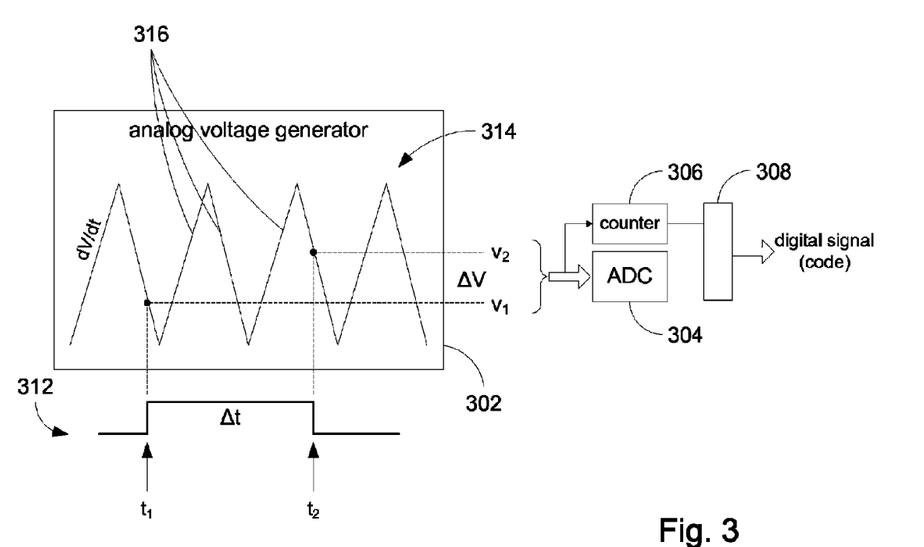
FIG. 3 is a generalized block diagram of another embodiment of a TDC in accordance with the present disclosure.

FIG. 3 shows a functional block diagram for a TDC 300 in accordance with other embodiments. The embodiment shown in FIG. 3 may be suitable where a greater conversion range of time inputs is involved. For example, a 1 ns TDC detection range using a 6 GV/s voltage ramp requires a voltage range of 0V to 6V. A voltage ramp from 0V to 6V may be impractical to implement. Accordingly, the TDC 300 may employ a cyclic analog voltage generator which produces a cyclic waveform. The analog voltage generator 300 shown in FIG. 3 is illustrated with a triangular waveform 314, but it will be appreciated that other known cyclic waveforms (e.g., sawtooth waveform) may be used. A timing signal 312 may be generated when a first input signal (not shown) is received at time $t_1$, and a second input signal (not shown) is received at time $t_2$. A ADC 304 quantizes 4 V, and a segment counter 306 counts the number of occurrences of complete segments 316 of the cyclic waveform 314 between time $t_1$ and time $t_2$. It can be appreciated that the counter 316 provides a coarse resolution conversion while the ADC component 314 provides a fine resolution conversion. An encoder 308 combines the coarse resolution data from the counter 306 with the fine resolution data from the ADC 304 to computer or otherwise produce a digital signal that is representative of the timing difference $\Delta t$.

Figure 4:
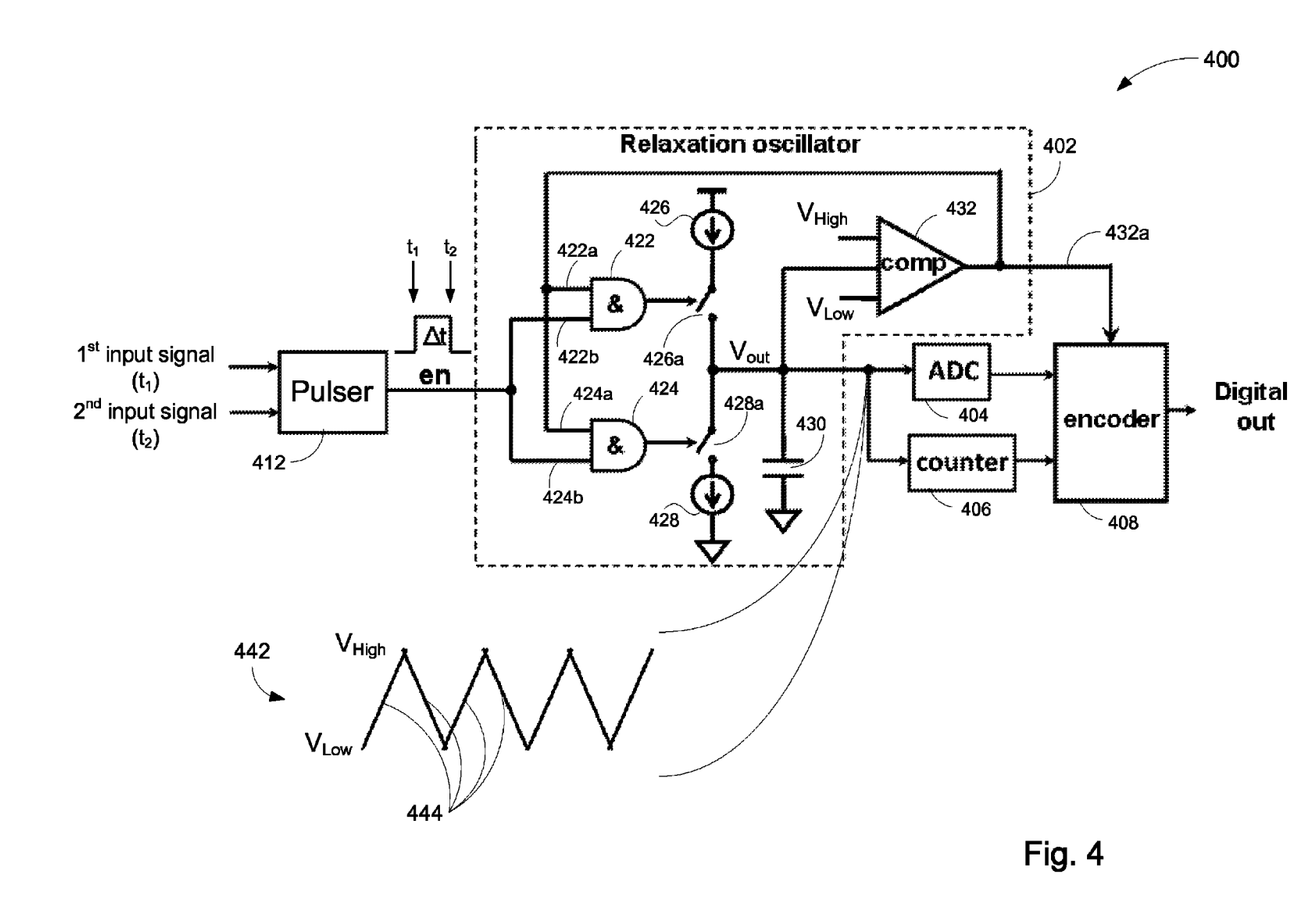
FIG. 4 is a block diagram showing details for an embodiment of a TDC.

In some embodiments, referring to FIG. 4, a TDC 400 includes an input section comprising a pulser circuit 412. The pulser circuit 412 receives a first input signal at a time $t_1$ and a second input signal at a time $t_2$. The pulser circuit 412 is configured to output a rising edge of a pulse at time $t_1$ in response to receiving the first input signal, and outputs a falling edge at time $t_2$ in response to receiving the second input signal. The output of the pulser circuit 412 feeds into a time-varying analog voltage generator 402.

In some embodiments, the voltage generator 402 comprises a relaxation oscillator circuit that generates a triangular waveform 442. It will be appreciated from the following discussion that any of several known circuits for producing a triangular waveform may be adapted for use in accordance with the present disclosure. In an embodiment, the relaxation oscillator circuit 402 comprises two AND gates 422 and 424, having respective first inputs 422a, 424a that receive the output of the pulser circuit 412. An output of AND gate 422 controls a switch 426a of a first current source 426. Likewise, an output of AND gate 424 controls a switch 428a of a second current source 428. The current sources 426 and 428 are connected in series. A node between the current sources 428 and 428 is connected to an output terminal $V_{out}$.

The output terminal $V_{out}$ is connected to a capacitor 430 and to a first input of a comparator 432. The comparator 432 includes a second input connected to a first reference level $V_{High}$ and a third input connected to a second reference level $V_{Low}$. An output of the comparator 432 is connected second inputs 422b and 424b of respective AND gates 422, 424. In an embodiment, the comparator 432 outputs a HI signal at power up. During operation, as $V_{out}$ increases from $<V_{High}$ to $>V_{High}$, the comparator 432 outputs LO, and remains LO until $V_{out}$ transitions from $>V_{Low}$ to $<V_{Low}$ after which point it outputs HI.

The TDC 400 further includes an ADC 404 which quantizes the voltage level at the output terminal $V_{out}$ and produces a representative digital output signal that feeds into an encoder 408. The voltage level at the output terminal $V_{out}$ is also sensed by a counter 406. The counter 406 is configured to count the number of occurrences of complete segments 444 of the triangular waveform 442. The counter 406 outputs a digital count signal that feeds into the encoder 408. The output of the comparator 432 also feeds into the encoder 408.

The pulse generated by the pulser circuit 412 represents the time difference between the first input signal and the second input signal, and more specifically, the width of the pulse $\Delta t$. The pulse enables operation of the relaxation oscillator 402. When enabled, the relaxation oscillator 402 outputs the triangular waveform 442 at its output terminal $V_{out}$. The counter 406 counts the number of complete segments 444 that have occurred during the time between $t_1$ and $t_2$, while the voltage level at the output terminal $V_{out}$ may be sampled by the ADC 404 at time $t_1$ and then again at time $t_2$. The encoder 408 may be configured to generate a digital signal that represents the time difference $\Delta t$. This aspect of the present disclosure will be discussed in connection with the flow chart shown in FIG. 5.

Figure 5:
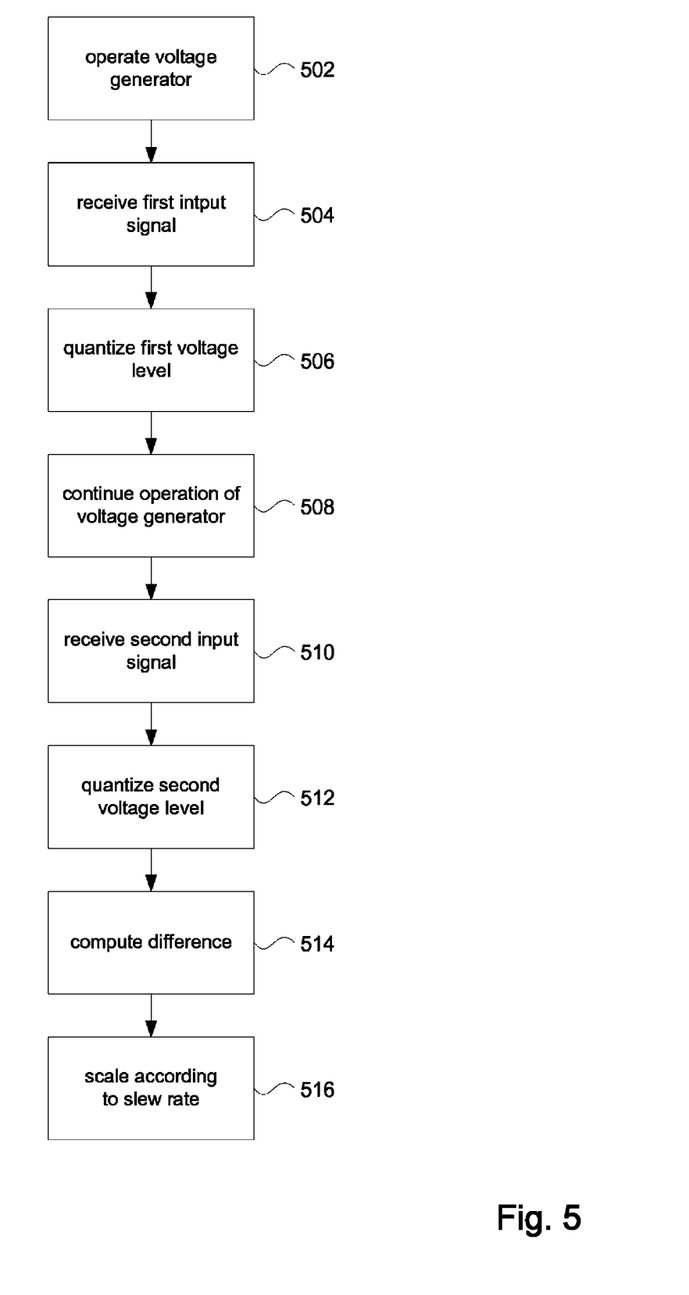
FIG. 5 is a workflow showing processing of a TDC in accordance with the disclosed embodiments.

Processing that takes place in a TDC in accordance with the present disclosure is illustrated in FIG. 5. In a step 502, the voltage generator (e.g., the relaxation oscillator circuit 402 in FIG. 4) is operated to produce a triangular waveform 442 at the output terminal $V_{out}$. The first input signal is received at time $t_1$ (step 504). At step 506, a voltage level (e.g., $v_1$ in FIG. 6) at the output terminal $V_{out}$ of the voltage generator 402 is quantized and loaded in the encoder 408. Time will pass until the second input signal is received at time $t_2$.

Figure 6:
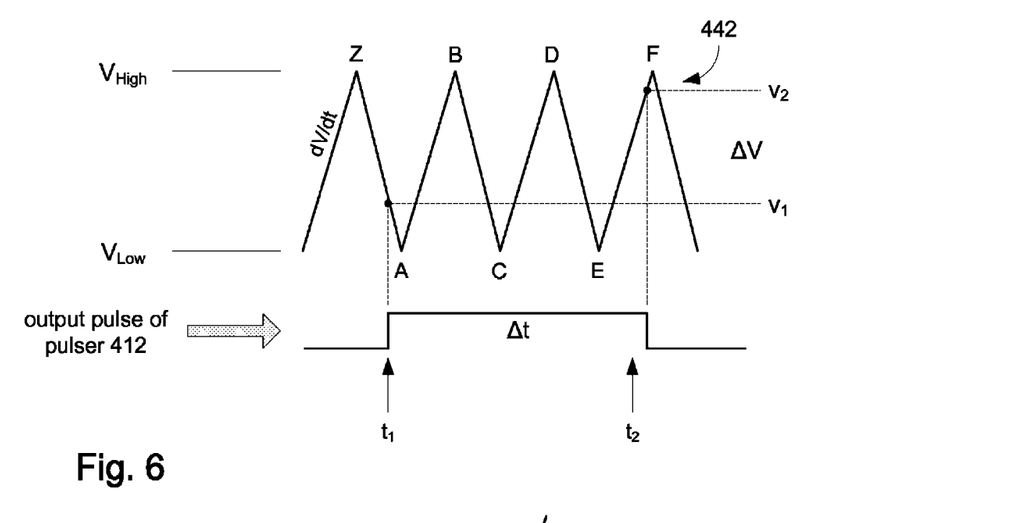
FIGS. 6 and 7 illustrate an example of a cyclic waveform and unfolding of the waveform in accordance with the present disclosure.

During step 508, the voltage generator continues to operate. For example, as the relaxation oscillator 402 continues to operate the counter 406 may detect multiple occurrences of segments 444 in the triangular waveform 442. A count maintained by the counter 406 is incremented for each complete segment 444 detected. Referring for a moment to FIG. 6, an example of an output pulse from pulser 412 in relation to a waveform 442 at the output terminal $V_{out}$ is illustrated. During the period between time $t_1$ and time $t_2$, four complete segments of the triangular waveform 442 occur, namely segments AB, BC, CD, and DE. With respect to the waveform 442, a "complete segment" may be defined as a segment of the waveform between $V_{High}$ and $V_{Low}$. Continuing with the flow chart in FIG. 5, when the second input signal is received at time $t_2$, in a step 510, the voltage level (e.g., $v_2$ in FIG. 6) at the output terminal $V_{out}$ is quantized and loaded into the encoder 408 at a step 512.

At a step 514, embodiments of the encoder 408 may be configured to produce a difference between the quantized voltage levels $v_1$ and $v_2$ (FIG. 6) obtained in steps 506 and 512. The encoder 408 may comprise logic such as programmable gate arrays, application specific integrated circuitry (ASIC), and so on, to compute or otherwise determine the difference. For example, if the voltage waveform is a straight line, such as waveform 214 in FIG. 2, then the encoder 408 may be configured to determine the voltage difference according to:

$$\Delta V = (v_2 - v_1). \qquad \text{Eqn. 5}$$

Figure 7:
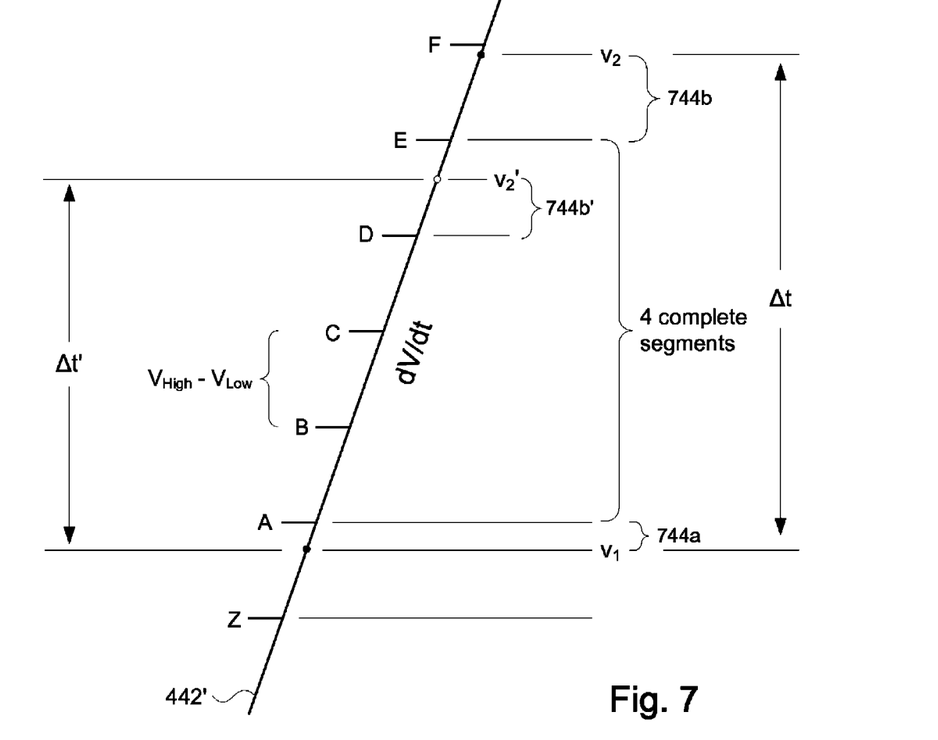

However, if the voltage waveform is cyclic, such as triangular waveform 442 in FIG. 6, then determining the difference between the quantized voltage levels $v_1$ and $v_2$ may require "unfolding" the waveform. An example is shown in FIG. 7, where an unfolded representation 442' of the waveform 442 is illustrated. As can be seen, the "difference" between quantized voltage levels $v_1$ and $v_2$ amounts to adding together the complete segments (e.g., AB, BC, CD, and DE) and the partial segments 744a and 744b. Each complete segment (e.g., BC) represents a voltage difference of ($V_{High}$-$V_{Low}$). The voltage difference in the partial segments 744a and 744b are computed relative to $V_{High}$ or $V_{Low}$. Accordingly, the encoder 408 may be configured to determine the voltage "difference" according to:

$$\Delta V = V_{segment1} + V_{segment2} + N \times (V_{High} - V_{Low}), \qquad \text{Eqn. 6}$$

where:
N is the number of detected complete segments supplied to the encoder 408 by the counter 406 (for example, in FIG. 6, N=4),
$V_{segment1}$ represents the voltage difference in partial segment 744a, and
$V_{segment2}$ represents the voltage difference in partial segment 744b.

In the example shown in FIG. 6, $V_{segment1}$ is given by ($v_1$-$V_{Low}$) and $V_{segment2}$=($v_2$-$V_{Low}$). It will be apparent that the voltage difference in a partial segment may be referenced to $V_{High}$ or $V_{Low}$, depending on whether the quantized voltage level was sampled on a positive slop of the triangular waveform 442 or a negative slop of the triangular waveform.

The example illustrated in FIG. 6 shows that the two quantized voltage levels $v_1$ and $v_2$ are taken on positive slopes, and hence are referenced to $V_{Low}$ as shown in FIG. 7. However, referring to FIG. 7, suppose instead of being in segment EF, the second voltage level is taken on a negative slope (e.g., segment DE), at $v_2$'. The voltage difference $V_{segment2}$ of partial segment 744b' would be computed relative to $V_{High}$ because the voltage at D is $V_{High}$. Accordingly, the time difference $\Delta t'$ would be based in part on $V_{segment2}$=($V_{High}$-$v_2$).

The output of comparator 432 provides a signal 432a to the encoder 408 that serves to indicate a state of operation of the voltage generator 402. In particular, the signal 432a indicates whether the slope of the triangular waveform 442 is positive or negative. The signal 432a thus informs the encoder 408 so that a logical unfolding of the triangular waveform 442 is properly performed so that a proper computation can be achieved.

Completing the discussion of FIG. 5, in a step 516, the obtained voltage difference $\Delta V$ is scaled by the slew rate per Eqn. 1 in order to obtain a value for $\Delta t$ (FIG. 7), the difference in time between the first input signal and the second input signal. It should be noted that time to digital conversion processing in accordance with the present disclosure does not require step 516. The process of converting a time value to a digital signal may be considered to be complete with step 514. The digital output of step 514 represents an encoding of the time value, and in some applications that may be sufficient. However, in other applications, step 516 may be performed if the actual time value needs to be digitally represented.

Referring to again to FIG. 4, the capacitor 430 in the relaxation oscillator circuit 402 stores the voltage level of the output terminal $V_{out}$. In other words, the voltage level is sampled and held by the capacitor 430 at the end of the pulse from the pulser circuit 412 rather than returning to 0V. When the relaxation oscillator circuit 402 is enabled upon receiving a subsequent pulse from the pulser circuit 412, oscillations will start from a voltage level based on the previously sampled voltage stored on the capacitor 430. In this way, quantization errors resulting from non-linearities in the circuitry (e.g., relaxation oscillator circuit 402, ADC 404) will average out, resulting in first-order quantization noise shaping thus reducing TDC noise. This reduced-noise aspect of the TDC 400 is advantageous in a closed loop PLL.

Figure 8:
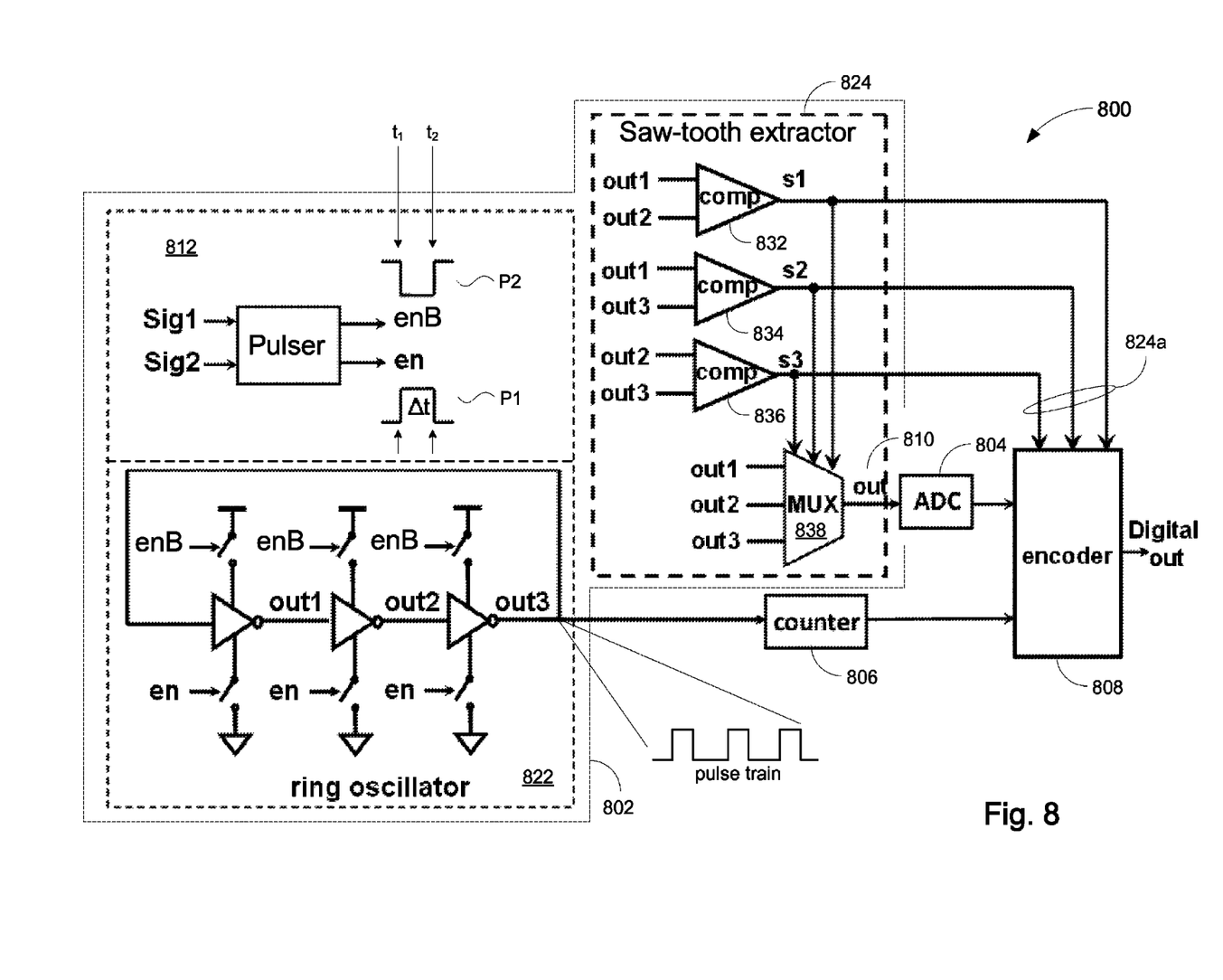
FIG. 8 is a block diagram showing details for another embodiment of a TDC.

In other embodiments, such as shown in FIG. 8, a TDC 800 may comprise a voltage generator 802 that employs an architecture based on a ring oscillator to generate a cyclic waveform. An input section in the voltage generator 802 comprises a pulser circuit 812 that receives a first input signal Sig1 at time $t_1$ and a second input signal Sig2 at time $t_2$. The pulser circuit 812 generates two pulses P1 and P2. The width $\Delta t$ of the pulses P1 and P2, is equal ($t_2$-$t_1$). Pulse P1 transitions from LO to HI when the first input signal is received, while pulse P2 transitions from HI to LO. When the second input signal is received at time $t_2$, pulse P1 transitions to LO and pulse P2 transitions to HI.

Figure 9:
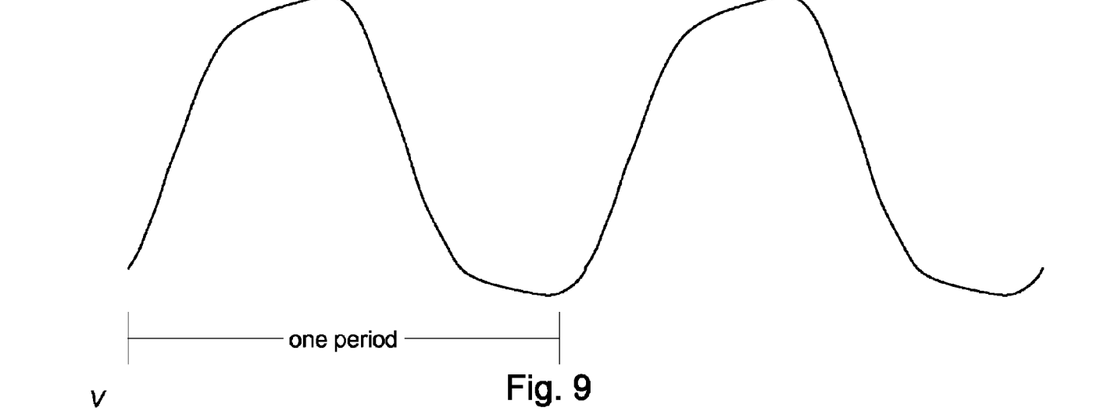
FIGS. 9 and 10 illustrate an example of waveform extraction in accordance with principles of the present disclosure.

The voltage generator further includes a ring oscillator 822 that is enabled and disabled by pulses P1 and P2. The ring oscillator 822 comprises a cascade of three inverters; however, higher numbers of cascaded inverters may be employed. The pulses P1 and P2, control three switches (e.g., CMOS transistors) which connect the respective inverters to first and second voltage potentials (e.g., ground and $V_{cc}$). Each inverter has an output designated out1, out2, and out3. The output out3 is also an output of the ring oscillator 822, producing a train of pulses. FIG. 9 represents a trace of the output out3 of a circuit simulation of a 3-stage ring oscillator.

In accordance with the present disclosure, the voltage generator 802 further includes an extractor circuit 824. That is connected to the outputs out1, out2, and out3 of the inverters of the ring oscillator 822. The extractor circuit 824 comprises three comparators 832, 834, and 836, each comparator receiving a combination of two inverter outputs from the ring oscillator 822. A 3-to-1 mux 838 receives the inverter outputs out1, out2, and out3 as mux inputs. A mux output is connected to an output terminal 810 of the voltage generator 802. The outputs s1, s2, and s3 of the comparators 832, 834, and 836 feed into a selector input of the mux 838.

An ADC 804 receives the output of one of the inverters of the ring oscillator 822, as selected by the mux, via the output terminal 810. The ADC 804 quantizes the voltage level at the output terminal and produces a representative digital output signal that feeds into an encoder 808. A counter 806 is connected to the output out3 of the ring oscillator 822. The counter counts the pulses in the pulse train. The counter 806 outputs a digital count signal that feeds into the encoder 808. The outputs s1, s2, and s3 of the comparators 832, 834, and 836 feed into the encoder 808 a signal 824a that indicates a state of operation of the voltage generator 802.

Figure 10:
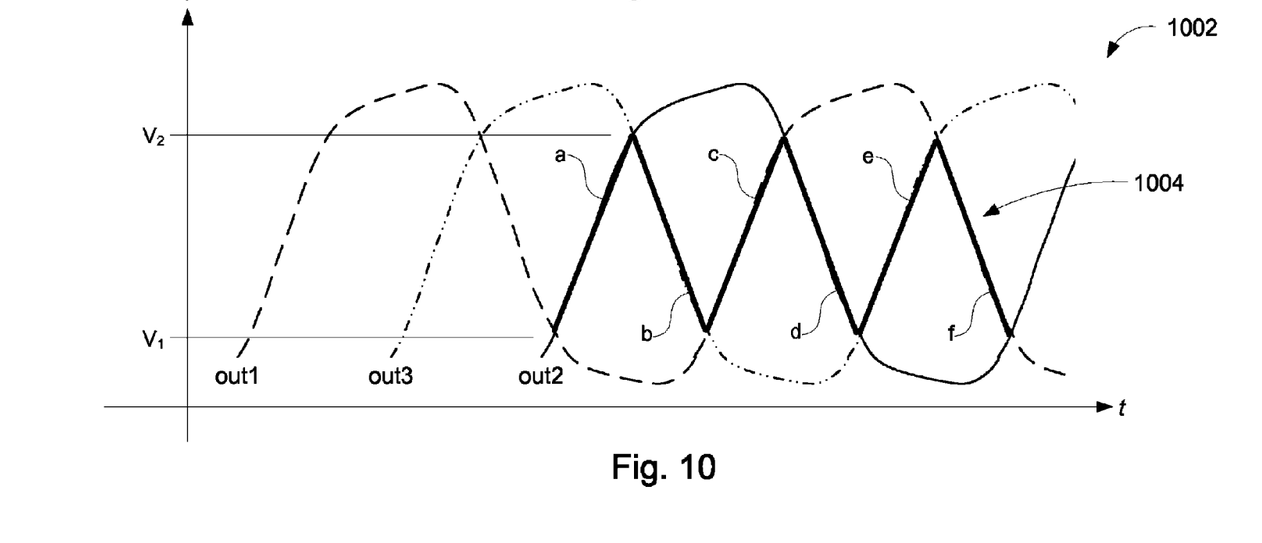

FIG. 10 represents a composite waveform 1002 created by superimposing traces of the waveforms at the outputs out1, out2, and out3 of the inverters of the ring oscillator 822. It was discovered that segments of the waveforms at the outputs out1, out2, and out3 are sufficiently linear so that a good approximation to a triangular pattern 1004 can be constructed in piecewise fashion.

Accordingly, in an embodiment, the extractor circuit 824 can be configured to generate at the output of its mux, the triangular pattern 1004 by extracting different pieces "a" through "f" of the waveforms at the outputs out1, out2, and out3 of the ring oscillator 822. For example, pieces a and d of the triangular pattern 1004 are extracted from the waveform of output out2. Likewise, pieces b and e are extracted from the waveform of output out3, and pieces c and f are extracted from the waveform of output out1. Accordingly, in an embodiment, the multiplexer logic for the mux 838 can be configured to generate the triangular pattern 1004 according to the following:

if $V_{out3} > V_{out2} > V_{out1}$, then output $V_{out2}$ (piece a)

if $V_{out2} > V_{out3} > V_{out1}$, then output $V_{out3}$ (piece b)

if $V_{out2} > V_{out1} > V_{out3}$, then output $V_{out1}$ (piece c)

if $V_{out1} > V_{out2} > V_{out3}$, then output $V_{out2}$ (piece d)

if $V_{out1} > V_{out3} > V_{out2}$, then output $V_{out3}$ (piece e)

if $V_{out3} > V_{out1} > V_{out2}$, then output $V_{out1}$ (piece f), where $V_{out1}$, $V_{out2}$, and $V_{out3}$, are voltage levels of respective outputs out1, out2, and out3.

In addition to identifying pieces of the triangular pattern 1004, the outputs s1, s2, and s3 of respective comparators 832, 834, and 836 indicate to the encoder 808 whether the sampled voltage is on a positive slope (rising edge) such as piece a (FIG. 10), or on a negative slope (falling edge) such as piece d (FIG. 10). With this information, the encoder 808 can perform a logical mapping of the triangular to a straight line as explained above in connection with FIG. 7.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present disclosure along with examples of how aspects of they may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the claims.

What is claimed is:

1. A method for time to digital conversion comprising steps of:
    receiving a first input signal;
    receiving a second input signal at a time subsequent to receiving the first input signal;
    generating a time-varying analog voltage signal at an output terminal;
    converting a voltage level at the output terminal to a first digital signal in response to receiving the first input signal;
    converting the voltage level at the output terminal to a second digital signal in response to receiving the second input signal;
    combining the first digital signal and the second digital signal to generate a digital signal that is representative of a time difference between the first input signal and the second input signal.

2. The method of claim 1 wherein generating a time-varying analog voltage signal includes generating a voltage ramp, wherein combining the first digital signal and the second digital signal includes incorporating a slew rate associated with the voltage ramp in order to generate the digital signal.

3. The method of claim 2 wherein a resolution of the time difference that is represented by the digital signal depends on the slew rate of the voltage ramp.

4. The method of claim 1 wherein generating a time-varying analog voltage signal includes generating a triangular waveform or a sawtooth waveform.

5. The method of claim 1 wherein the time-varying analog voltage signal is a cyclic analog voltage signal.

6. The method of claim 5 further comprising counting a number of transitions of the cyclic analog voltage signal during a period of time between receipt of the first input signal and receipt of the second input signal, wherein the digital signal that is representative of a time difference between the first input signal and the second input signal is based on the number of transitions in addition to the first digital signal and the second digital signal.

7. The method of claim 1 further comprising a reference signal of a phase locked loop receiving as the first input signal and receiving an output signal of the phase locked loop as the second input signal.

8. The method of claim 7 wherein the output signal of the phase locked loop is divided down to produce the second input signal.

9. A time-to-digital converter (TDC) comprising:
    an input block to receive a first input signal and a second input signal;
    a voltage generator configured to output a time-varying analog voltage level;
    an analog-to-digital converter (ADC) configured to output digital signals representative of voltage levels output by the voltage generator; and
    an encoder connected to the ADC to receive digital signals from the ADC,
    wherein the ADC generates a first digital signal when the input block receives the first input signal, wherein the ADC generates a second digital signal when the input block receives the second input signal, wherein the encoder combines the first digital signal and the second digital signal to generate a third digital signal that is representative of a time difference between receipt of the first input signal and receipt of the second input signal.

10. The TDC of claim 9 wherein the voltage generator generates a voltage ramp, wherein the encoder further combines a slew rate associated with the voltage ramp with the first digital signal and the second digital signal in order to generate the third digital signal.

11. The TDC of claim 10 wherein a resolution of the time difference that is represented by the third digital signal depends on the slew rate of the voltage ramp.

12. The TDC of claim 9 wherein the voltage generator is further configured to output a state signal indicative of a state of operation of the voltage generator, wherein the encoder further combines the state signal with the first digital signal and the second digital signal in order to generate the third digital signal.

13. The TDC of claim 9 wherein the time-varying voltage level is a cyclic voltage signal.

14. The TDC of claim 13 further comprising a counter configured to count a number of transitions of the cyclic voltage signal during a period of time between receipt of the first input signal and receipt of the second input signal, wherein the third digital signal that is representative of a time difference between the first input signal and the second input signal is based on the number of transitions in addition to the first digital signal and the second digital signal.

15. The TDC of claim 9 further comprising a phase locked loop (PLL), wherein a reference signal of the PLL is the first input signal and an output signal of the PLL is the second input signal.

16. A circuit comprising:
means for receiving a first input signal and a second input signal;
means for generating a time-varying analog voltage level;
means for converting the time-varying analog voltage level to digital signals, wherein a first digital signal is produced in response to receiving the first input signal at a time $t_1$ and a second digital signal is produced in response to receiving the second input signal at a time $t_2$;
means for encoding the first digital signal and the second digital signal to produce a third digital signal representative of a time difference between receipt of the first input signal and receipt of the second input signal.

17. The circuit of claim 16 wherein the means for generating includes generating a state signal indicative of its state of operation, wherein the means for encoding further combining the state signal with the first digital signal and the second digital signal in order to generate the third digital signal.

18. The circuit of claim 16 wherein the time-varying voltage level is a cyclic voltage signal.

19. The circuit of claim 18 further comprising means for counting a number of transitions of the cyclic voltage signal during a period of time between receipt of the first input signal and receipt of the second input signal, wherein the third digital signal that is representative of a time difference between the first input signal and the second input signal is based on the number of transitions in addition to the first digital signal and the second digital signal.

* * * * *